United States Patent
Disney

(10) Patent No.: US 6,552,597 B1
(45) Date of Patent: Apr. 22, 2003

(54) INTEGRATED CIRCUIT WITH CLOSELY COUPLED HIGH VOLTAGE OUTPUT AND OFFLINE TRANSISTOR PAIR

(75) Inventor: Donald Ray Disney, Cupertino, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 10/053,538

(22) Filed: Nov. 2, 2001

(51) Int. Cl.[7] .................................. H03K 17/687
(52) U.S. Cl. ............................ 327/427; 327/434
(58) Field of Search .......................... 327/108, 112, 327/333, 407–409, 534, 537, 415, 416, 427, 434; 326/83, 87

(56) References Cited

U.S. PATENT DOCUMENTS

| 5,334,880 | A | * | 8/1994 | Abadeer et al. | 257/50 |
|---|---|---|---|---|---|
| 5,338,978 | A | * | 8/1994 | Larsen et al. | 327/534 |
| 5,512,853 | A | * | 4/1996 | Ueno et al. | 327/108 |
| 5,748,025 | A | * | 5/1998 | Ng et al. | 327/112 |
| 5,818,284 | A | * | 10/1998 | Murakami et al. | 327/427 |
| 5,994,922 | A | * | 11/1999 | Aoki et al. | 326/87 |
| 6,005,418 | A | * | 12/1999 | Taki | 326/113 |
| 6,198,308 | B1 | * | 3/2001 | Morrill | 326/83 |
| 6,316,807 | B1 | * | 11/2001 | Fujishima et al. | 257/333 |

* cited by examiner

Primary Examiner—Terry D. Cunningham
Assistant Examiner—Long Nguyen
(74) Attorney, Agent, or Firm—Burgess & Bereznak, LLP

(57) ABSTRACT

An integrated circuit fabricated in a single silicon substrate includes a high-voltage output transistor having source and drain regions separated by a channel region, and a gate disposed over the channel region. Also included is an offline transistor having source and drain regions separated by a channel region and a gate disposed over the channel region of the offline transistor. A drain electrode is commonly coupled to the drain region of the high-voltage output transistor and to the drain region of the offline transistor.

32 Claims, 4 Drawing Sheets

INTEGRATED CIRCUIT WITH CLOSELY COUPLED HIGH VOLTAGE OUTPUT AND OFFLINE TRANSISTOR PAIR

FIELD OF THE INVENTION

The present invention relates to power integrated circuits. More spefically, the present invention relates to a high-voltage, field-effect transistors fabricated on a single silicon substrate with other transistor devices.

BACKGROUND OF THE INVENTION

A common type of integrated circuit device is a metal-oxide-semiconductor field effect transistor (MOSFET). A MOSFET is a field effect device that includes a source region, a drain region, a channel region extending between the source and drain regions, and a gate provided over the channel region. The gate includes a conductive gate structure disposed over and insulated from the channel region by a thin oxide layer.

Power MOSFET devices are widely used for high voltage circuit applications, e.g., greater than 200 volts. Examples of traditional MOSFET device structures for power applications include U.S. Pat. Nos. 5,869,875, 5,821,144, 5,760,440, and 4,748,936. Each of these devices has a source region and a drain region separated by an intermediate region. A gate structure is disposed over a thin oxide layer over the metal-oxide-semiconductor (MOS) channel of the device. In the on state, a voltage is applied to the gate to cause a conduction channel to form between the source and drain regions, thereby allowing current to flow through the device. In the off state, the voltage on the gate is sufficiently low such that no conduction channel is formed in the substrate, and thus no current flow occurs. In this condition, high voltage is supported between the drain and source regions.

Power transistors are often designed with interdigitated source and drain regions. Such a device structure is disclosed in U.S. Pat. No. 6,084,277, which is assigned to the assignee of the present application. The '277 patent teaches a lateral power MOSFET or transistor having an improved gate design that provides a large safe operating area (SOA) performance level and high current capability with moderate gate speed to suppress switching noise.

Many power integrated circuits (ICs) contain one or more large high-voltage output transistors that control the current flow to one or more external loads. In a switch-mode power supply IC, for example, a single large high-voltage output transistor controls the current through the primary winding of a transformer and thereby controls the power delivered by the power supply. In certain applications it is also useful to include an additional high-voltage transistor on the same silicon substrate to provide a lower current coupled to, say, an external capacitor, for the purpose of assisting in the start-up of the chip or other external circuit. Such an additional high-voltage transistor is frequently referred to as an "offline" transistor, even though it resides in the same substrate as the high-voltage output transistor. (In the context of the present application, the term "offline transistor" refers to a transistor having its drain region coupled to the same external line voltage as the output transistor, but which has its gate connected to a different internal circuit node than that of the output transistor.)

FIG. 1 shows a typical prior art power device 10 that includes an integrated circuit 11 housed within a chip carrier package. Integrated circuit 11 has an offline transistor 12 located in the upper right corner of the chip and an output transistor 13 located in another area of the same substrate. In conventional manner, bonding wires facilitate electrical connection between the bonding pads located on IC 11 and the various pins of the chip package. For example, FIG. 1 shows a bonding wire 21 connected between a bonding pad 20 located on the drain electrode 14 of offline transistor 12 and pin 19 of device 10. Similarly, wires 17 connect bonding pads 16 on drain electrode 15 of output transistor 13 to pins 18 and 19. Also shown are wires 28 connecting bonding pads 27 to pin 29, and wire 24 connecting pad 25 to pin 23. By way of example, bonding pads 27 and pin 29 may provide a connection to ground for IC 11, whereas pad 25 and pin 23 may connect to an external capacitor utilized for start-up purposes.

The prior art approach of FIG. 1 has several drawbacks. First, the offline transistor 12 is large and occupies a significant portion of silicon area. Offline transistor 12 also needs its own bonding pad 20, which is quite large relative to the active area of the offline transistor. This greatly reduces the area efficiency of offline transistor 12. Secondly, the inductance of the drain bond wires 17 & 21 decouples offline transistor 12 from output transistor 13 during fast switching transients. This latter effect limits the ability of the output transistor to protect the offline transistor from potentially destructive high voltages that may be present at pins 18 and 19 of power device 10.

Therefore, what is needed is a power IC that overcomes the disadvantages inherent in the prior art.

BRIEF DESCRIPTION OF THE DRAWINGS

The present invention is illustrated by way of example, and not limitation, in the figures of the accompanying drawings, wherein.

DETAILED DESCRIPTION

A power device and integrated circuit with a closely coupled pair of transistors is described. In the following description, numerous specific details are set forth, such as material types, dimensions, circuit configurations, etc., in order to provide a thorough understanding of the present invention. Practitioners having ordinary skill in the IC arts will understand that the invention may be practiced without many of these details. In other instances, well-known circuit elements, techniques, and processing steps have not been described in detail to avoid obscuring the invention.

The present invention includes a power integrated circuit that is typically housed in a package or chip carrier. The integrated circuit comprises a high-power output power transistor that is closely coupled with an offline transistor on the same silicon substrate. In one embodiment, disposing the offline transistor adjacent to the output transistor and connecting the drain regions of the transistor pair to a common drain electrode achieves close coupling between the output transistor and the offline transistor. The drain electrode includes one or more bonding pad areas for connecting the output and offline transistors to a pin of the package. In a typical application, the drain electrode pin is coupled to a high-voltage supply line through a load.

Figure 1:
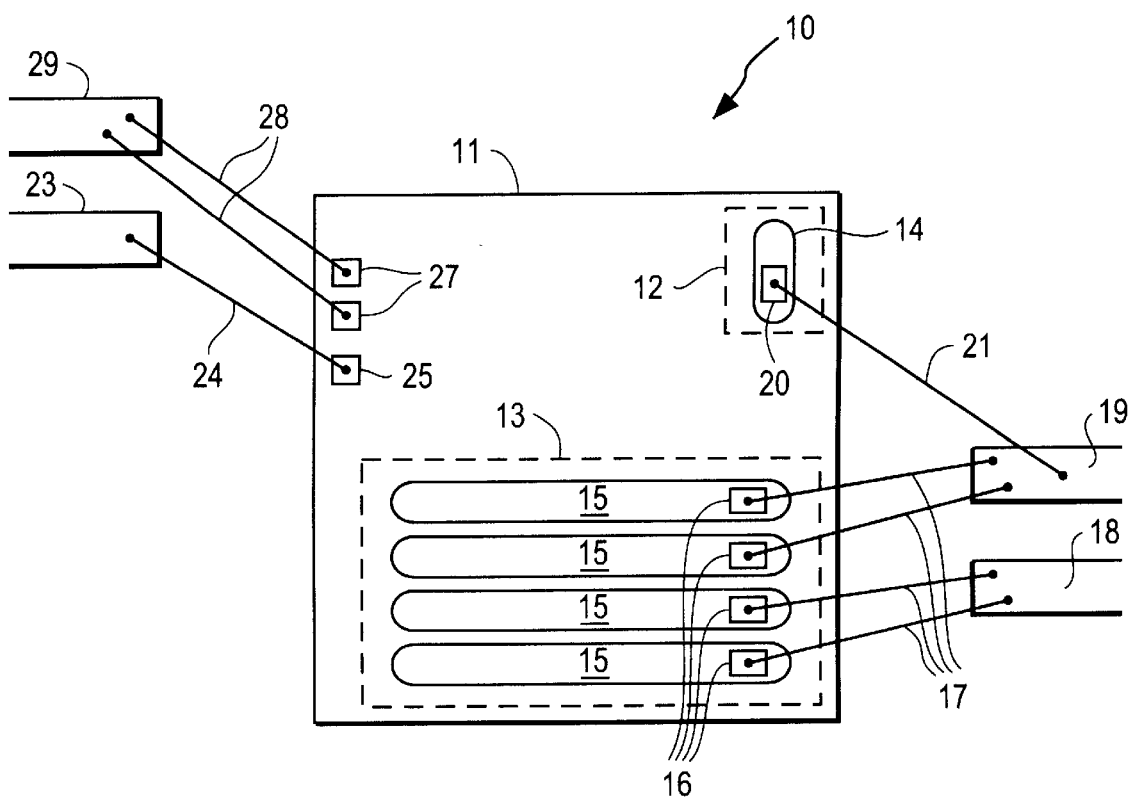
FIG. 1 is a top view of a prior art power IC chip package.
Figure 2:
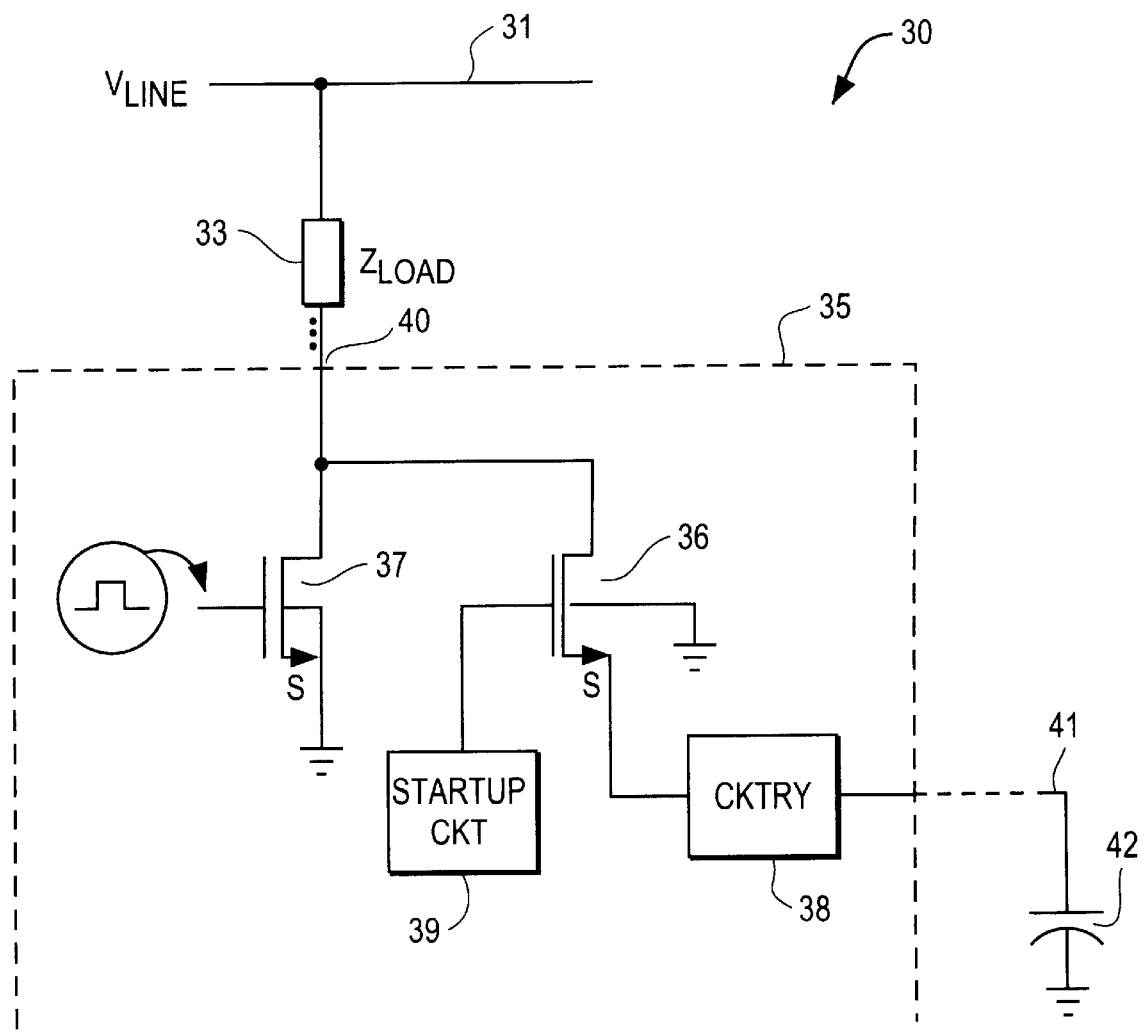
FIG. 2 is a circuit schematic diagram of one embodiment of the present invention.

FIG. 2 is a circuit schematic diagram of the power device 30 of the present invention, wherein IC 35 is shown being coupled through an output pin 40 to a load 33. Load 33, in turn, is connected to supply line 31, which provides a high line voltage, $V_{LINE}$. The drain regions of high-voltage output transistor 37 and offline transistor 36 are commonly coupled to output pin 40. Output transistor 37 is shown having its source and body (e.g., substrate) regions coupled to ground potential. The gate of high-voltage output transistor 37 is coupled to switching circuitry on IC 35, which controls the on/off state of transistor 37. Typically, the switching circuitry that drives the gate of output transistor 37 comprises ordinary logic that produces some sort of a digital pulse signal, e.g., a pulse width modulation signal, that controls the operation of transistor 37.

The main function of offline transistor 36 is to provide start-up current for IC 35. Accordingly, the source region of offline transistor 36 is not grounded, as is the case for transistor 37. Instead, the body region of transistor 36 is grounded and the source of offline transistor 36 is coupled to circuitry 38 that provides output current at pin 41 of the device. The current provided at pin 41 is used to charge-up an external capacitor 42. It is appreciated that the charge-up circuitry 38 may comprise a wide variety of known analog or digital circuits useful for providing current to charge a capacitor. In certain applications, circuitry 38 may be eliminated and the source of offline transistor may be coupled directly to pin 41.

The gate of offline transistor 36 is coupled to startup circuitry 39 in FIG. 2, which comprises conventional control logic designed to turn-on transistor during the powering up of IC 35. Typically, circuit 39 functions by turning on transistor 36 for a time period sufficient to generate enough current to fully charge capacitor 42.

Figure 3:
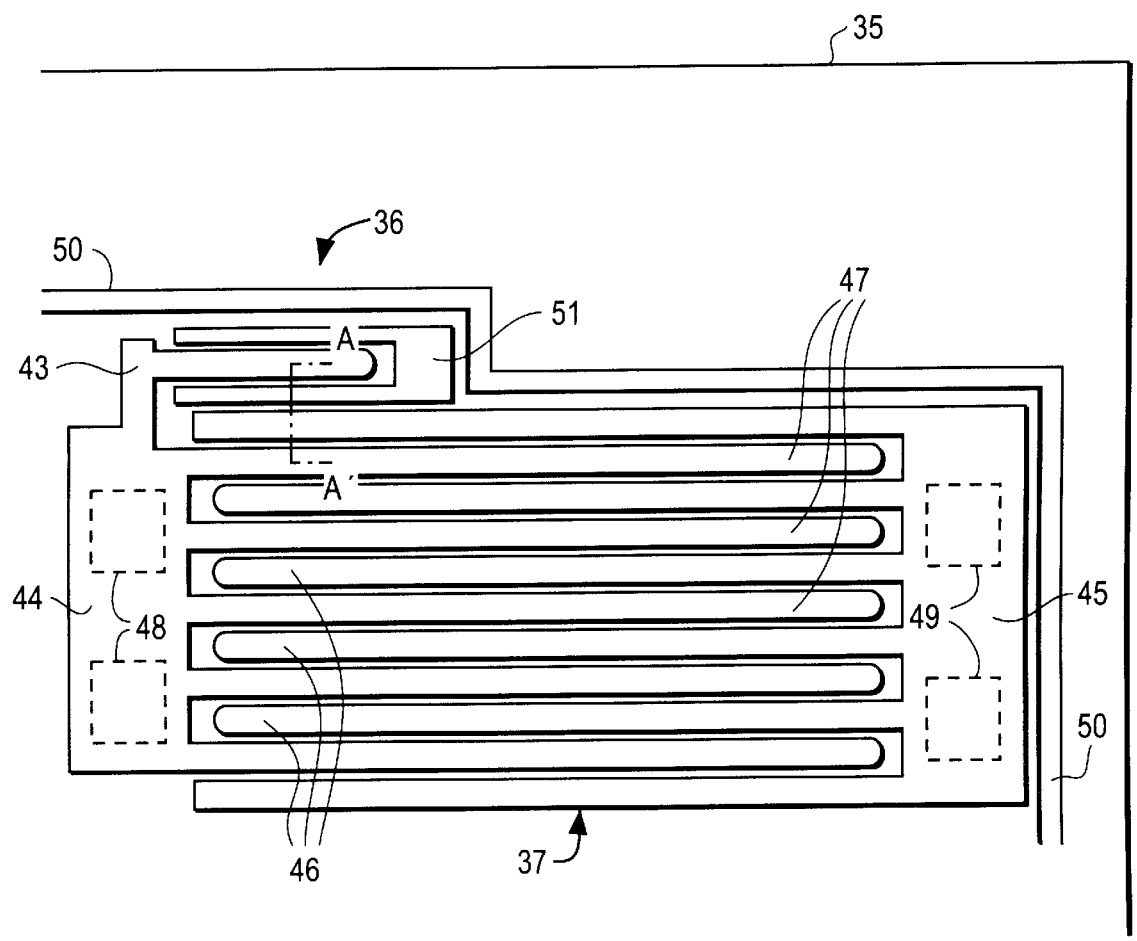
FIG. 3 is a top layout view of a portion of an integrated circuit according to one embodiment of the present invention.
Figure 4:
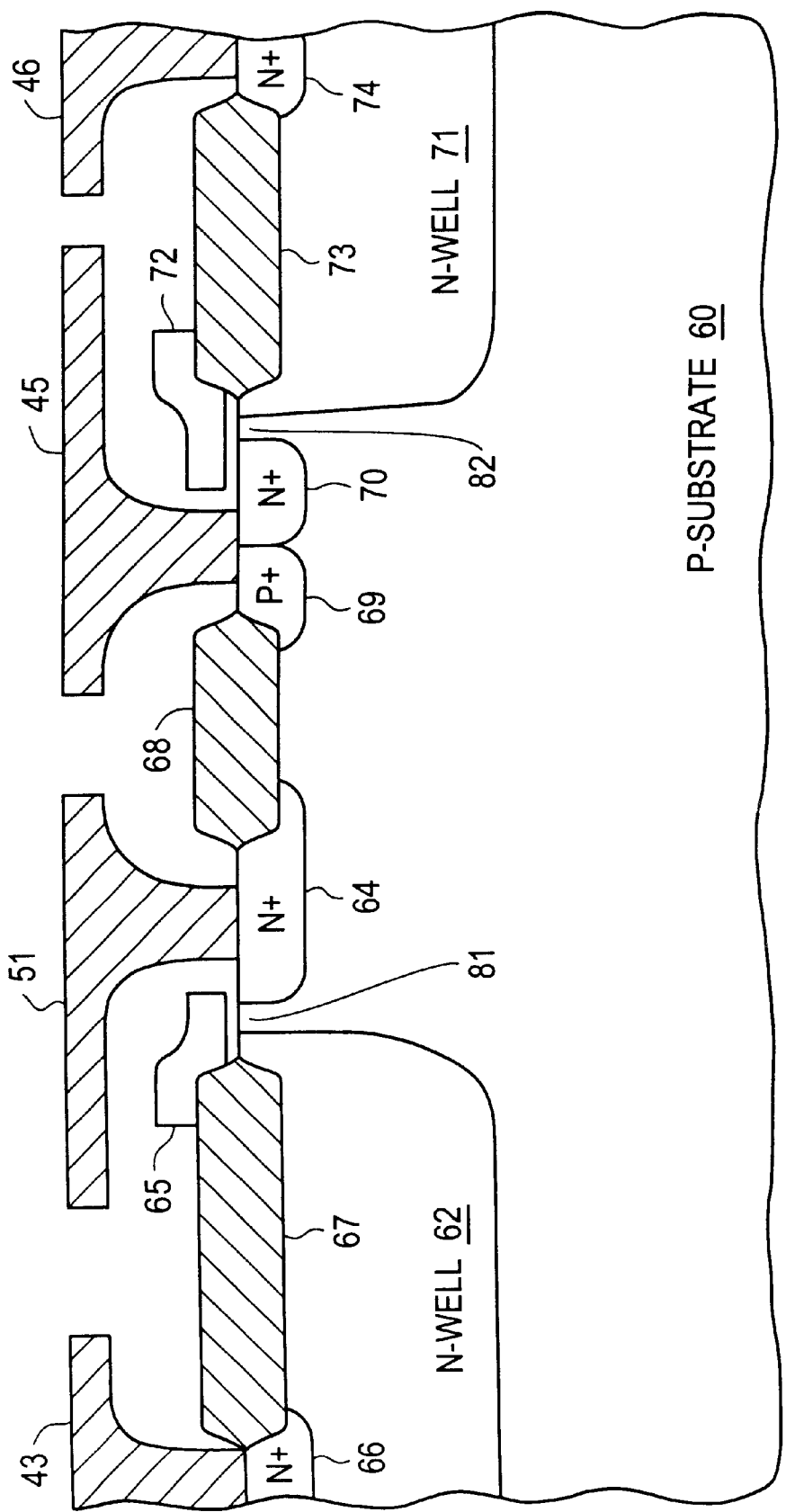
FIG. 4 is a cross-sectional side view of the closely coupled transistor pair shown in the embodiment of FIG. 3.

Referring now to FIG. 3, there is shown a top layout view of IC 35 in accordance with one embodiment of the present invention. In the embodiment of FIG. 3, only the drain and source electrode metalization patterns for transistors 36 and 37 are illustrated. FIG. 4 is a cross-sectional side view of the closely coupled transistor pair taken through cut lines A–A', showing the doped semiconductor regions of the respective transistors. As can be seen, output transistor 37 and offline transistor 36 each comprise interdigitated source and drain regions. For example, elongated source electrode fingers 46 are shown interdigitated with drain electrode fingers 47 of the high-voltage output transistor 37. Offline transistor 36 includes a single drain electrode finger 43 interdigitated between a pair of source fingers comprising source electrode 51.

Note that the offline and output transistors are disposed adjacent to one another in the same substrate. This allows both transistors to merge their respective drain electrode fingers into a common drain electrode 44. FIG. 3 illustrates common drain electrode 44 including an area sufficiently large to accommodate the placement of bonding pads 48. Since the offline and output transistors share drain electrode 44 and bonding pads 48, the need for offline transistor to have its own bond pad is obviated in accordance with the present invention. Moreover, the common drain electrode 44 closely couples the drain voltages of the offline and output transistors, thereby allowing the larger output transistor 37 to protect offline transistor 36 from high voltage transients.

In addition, offline transistor 36 may be configured so as to have a higher breakdown voltage as compared to output transistor 37. This may be accomplished, for example, by layout design differences wherein offline transistor 36 has a longer extended drain region and/or larger radius fingertip regions as compared to output transistor 37. In other embodiments, the control circuit of the power device may function so as to turn off transistor 36 before transistor 37 in order to protect the offline transistor from high voltage transients caused by the switching off of the output transistor.

In the completely packaged power device, bonding pads 48 are connected by one or more bonding wires to the high-voltage output pin 40, which is coupled to $V_{LINE}$ through load 33. Likewise, bonding pads 49 are provided on the source electrode 45 at the opposite end of transistor 37. Bonding pads 49 are connected to a ground potential during operation of the power device of the present invention.

Also shown in FIG. 3 is a guard ring metal trace 50 that is included in this particular embodiment for the purpose of isolating both the high-voltage output transistor 37 and offline transistor 36 from other circuitry on IC 35. Guard ring 50 is usually coupled to an underlying well region in the substrate. Without guard ring 50 the operation of transistors 36 and 37 might cause disruption of the switching and startup circuitry on the chip through carrier injection into the substrate. Guard ring 50 prevents additional charge carriers generated by transistors 36 & 37 from finding their way to nearby controller circuits.

FIG. 4 illustrates the relative location of the source region, drain region and gate of each of transistors 36 & 37 in one embodiment of the present invention. Drain region 66 of offline transistor 36 is shown disposed in a N-well region 62, whereas drain region 74 of output transistor 37 is disposed in a separate N-well region 71. Drain electrode finger 43 of transistor 36 connects to drain region 66, and drain electrode finger 46 of transistor 37 connects to drain region 74. Both drain electrode fingers 43 and 46 merge into a single common drain electrode 44, as shown in FIG. 3. Thus, while output and offline transistors 36 & 37 share a common drain electrode 44, their drain diffusion regions 66 and 74 are disposed in separate N-well regions 62 and 71, respectively.

The source diffusion region 64 of offline transistor 36 is disposed in P-substrate 60 separated from N-well 62 by a channel region 81. The extended drain region of transistor 36 comprises the N-type semiconductor material between N+ region 66 and the boundary of N-well 62 adjacent channel region 81. A thick field oxide layer 67 covers the surface of the extended drain region. An insulated polysilicon gate 65 is disposed over channel region 81 and slightly overlaps field oxide region 67 for field plating purposes. Source electrode 51 of offline transistor 36 connects with N+ source region 64 and includes an extended portion over gate 65, which acts as a field plate.

The same basic transistor structure is shown for output transistor 37. For example, a channel region 82 separates source region 70 from the extended drain boundary of N-well 71. Insulated gate 72 is disposed above channel region 82 and extends over field oxide layer 73 for field plating purposes. The source electrode 45 of output transistor 37 also includes a field plate portion that extends over gate 72. An additional P+ region 69 is shown disposed in substrate 60 next to source diffusion region 70. Source electrode 45 contacts both P+ region 69 and N+ source region 70 as a convenient way of connection both the body (i.e., substrate) and source regions of transistor 37 to the same ground potential. Because channel regions 81 and 82 of respective transistors 36 and 37 share the same body region in substrate 60, the connection to P+ region 69 also grounds the body region of transistor 36. P+ region 69 is separated at the surface from N+ source region 64 by field oxide layer 68.

I claim:

1. An integrated circuit (IC) in a substrate comprising:
   a high-voltage output transistor having source and drain regions separated by a channel region, and a gate disposed over the channel region;
   an offline transistor having source and drain regions separated by a channel region and a gate disposed over the channel region of the offline transistor, the offline transistor having a first breakdown voltage and the high-voltage output transistor having a second breakdown voltage, the first breakdown voltage being higher than the second breakdown voltage;
   a drain electrode commonly coupled to the drain region of the high-voltage output transistor and the drain region of the offline transistor;
   wherein the high-voltage output transistor and the offline transistor have the same conductivity type.

2. The integrated circuit according to claim 1 further comprising:
   switching circuitry coupled to the gate of the high-voltage output transistor; and
   startup circuitry coupled to the gate of the offline transistor.

3. The integrated circuit according to claim 1 further comprising:
   a first source electrode connected to the source region of the offline transistor; and
   additional circuitry coupled to the first source electrode for driving current to an external device.

4. The integrated circuit according to claim 1 wherein the offline transistor is disposed adjacent the high-voltage output transistor in the substrate.

5. The integrated circuit according to claim 3 further comprising:
   a second source electrode connected to the source region of the high-voltage output transistor, the second source electrode connected to a ground potential.

6. The integrated circuit according to claim 1 wherein the source regions of the high-voltage output and offline transistors are disposed in a common body region.

7. The integrated circuit according to claim 1 wherein the drain region of the high-voltage output transistor is disposed in a first well region, and the drain region of the offline transistor is disposed in a second well region.

8. The integrated circuit according to claim 1 wherein the drain and source regions of the high-voltage output transistor are interdigitated.

9. The integrated circuit according to claim 1 wherein the drain and source regions of the offline transistor are interdigitated.

10. A power device comprising:
    an integrated circuit (IC) in a substrate that includes:
       a high-voltage output transistor having source and drain regions separated by a channel region, and a gate disposed over the channel region;
       an offline transistor having source and drain regions separated by a channel region and a gate disposed over the channel region of the offline transistor, the offline transistor having a first breakdown voltage and the high-voltage output transistor having a second breakdown voltage, the first breakdown voltage being higher than the second breakdown voltage;
       a drain electrode commonly coupled to the drain region of the high-voltage output transistor and the drain region of the offline transistor;
       wherein the high-voltage output transistor and the offline transistor have the same conductivity type; and
    a package housing the integrated circuit, the package having a first pin connected to the drain electrode.

11. The power device according to claim 10 wherein the integrated circuit further comprises:
    switching circuitry coupled to the gate of the high-voltage output transistor; and
    startup circuitry coupled to the gate of the offline transistor.

12. The power device according to claim 11 further comprising:
    a first source electrode connected to the source region of the offline transistor;
    additional circuitry coupled to the first source electrode for driving current to an external device; and
    a second pin of the package connected to the additional circuitry.

13. The power device according to claim 10 wherein the offline transistor is disposed adjacent the high-voltage output transistor in the substrate.

14. The power device according to claim 12 further comprising:
    a second source electrode connected to the source region of the high-voltage output transistor; and
    a ground pin connected to the second source electrode.

15. The power device according to claim 10 wherein the source regions of the high-voltage output and offline transistors are disposed in a common body region of the substrate.

16. The power device according to claim 10 wherein the drain region of the high-voltage output transistor is disposed in a first well region, and the drain region of the offline transistor is disposed in a second well region.

17. The power device according to claim 10 wherein the drain and source regions of the high-voltage output transistor are interdigitated.

18. The power device according to claim 10 wherein the drain and source regions of the offline transistor are interdigitated on the integrated circuit.

19. The power device according to claim 12 wherein the external device comprises a capacitor.

20. A circuit comprising:
    an integrated circuit (IC) in a substrate that includes:
       a high-voltage output transistor having source and drain regions separated by a channel region, and a gate disposed over the channel region;
       an offline transistor having source and drain regions separated by a channel region, and a gate disposed over the channel region of the offline transistor, the offline transistor having a first breakdown voltage and the high-voltage output transistor having a second breakdown voltage, the first breakdown voltage being higher than the second breakdown voltage;
       a drain electrode commonly coupled to the drain region of the high-voltage output transistor and the drain region of the offline transistor;
       wherein the high-voltage output transistor and the offline transistor have the same conductivity type;

a package housing the IC, the package having a first pin connected to the drain electrode;

a supply line; and a load coupled between the supply line and the first pin of the package.

21. An integrated circuit fabricated on a substrate comprising:

a high-voltage output MOSFET having interdigitated source and drain regions separated by a channel region, and a gate disposed over the channel region;

an offline transistor having interdigltated source and drain regions separated by a channel region, and a gate disposed over the channel region of the offline transistor, the drain region of the offline transistor being disposed in a first well region and the drain region of the high-voltage transistor being disposed in a second well region, the source regions of the high-voltage output and offline transistors are disposed in a common body region of the substrate interposed between the first and second well regions, the offline transistor having a first breakdown voltage and the high-voltage output transistor having a second breakdown voltage, the first breakdown voltage being higher than the second breakdown voltage;

a drain electrode commonly coupled to the drain region of the high-voltage output transistor and the drain region of the offline transistor;

wherein the high-voltage output transistor and the offline transistor have the same conductivity type.

22. The integrated circuit according to claim 21 further comprising:

switching circuitry coupled to the gate of the high-voltage output transistor; and startup circuitry coupled to the gate of the offline transistor.

23. The integrated circuit according to claim 21 further comprising:

a first source electrode connected to the source region of the offline transistor; and a second source electrode connected to the source region of the high-voltage output transistor.

24. The integrated circuit according to claim 23 further comprising:

additional circuitry coupled to the first source electrode for driving current to an external device; and wherein the second source electrode is connected to a ground plane.

25. An integrated circuit (IC) in a substrate comprising:

an output node;

a high-voltage output transistor having source and drain regions separated by a channel region, and a gate disposed over the channel region;

an offline transistor having source and drain regions separated by a channel region and a gate disposed over the channel region of the offline transistor, the offline transistor having a first breakdown voltage and the high-voltage output transistor having a second breakdown voltage, the first breakdown voltage being higher than the second breakdown voltage;

a drain electrode connected to the output node and commonly coupled to the drain region of the high-voltage output transistor and the drain region of the offline transistor;

wherein the high-voltage output transistor and the offline transistor have the same conductivity type.

26. The integrated circuit according to claim 25 wherein the offline transistor is disposed adjacent the high-voltage output transistor in the substrate.

27. The integrated circuit according to claim 25 further comprising:

a first source electrode connected to the source region of the offline transistor; and additional circuitry coupled to the first source electrode for driving current to an external device.

28. The integrated circuit according to claim 27 further comprising:

a second source electrode connected to the source region of the high-voltage output transistor, the second source electrode connected to a ground potential.

29. The integrated circuit according to claim 25 wherein the source regions of the high-voltage output and offline transistors are disposed in a common body region.

30. The integrated circuit according to claim 25 wherein the drain region of the high-voltage output transistor is disposed in a first well region, and the drain region of the offline transistor is disposed in a second well region.

31. The integrated circuit according to claim 25 wherein the drain and source regions of the high-voltage output transistor are interdigitated.

32. The integrated circuit according to claim 25 wherein the drain and source regions of the offline transistor are interdigitated.

* * * * *